United States Patent
Alrasheed et al.

(10) Patent No.: US 11,906,135 B2
(45) Date of Patent: Feb. 20, 2024

(54) CLEANSING ADSORPTION BED UTILIZING METAL-ORGANIC FRAMEWORK

(71) Applicants: Abdullah Alrasheed, Los Angeles, CA (US); Majed AlHarbi, Los Angeles, CA (US)

(72) Inventors: Abdullah Alrasheed, Los Angeles, CA (US); Majed AlHarbi, Los Angeles, CA (US)

( * ) Notice: Subject to any disclaimer, the term of this patent is extended or adjusted under 35 U.S.C. 154(b) by 0 days.

(21) Appl. No.: 18/143,558

(22) Filed: May 4, 2023

(65) Prior Publication Data
US 2023/0272892 A1 Aug. 31, 2023

Related U.S. Application Data

(63) Continuation-in-part of application No. 17/840,912, filed on Jun. 15, 2022, now Pat. No. 11,703,199, which is a continuation of application No. 17/368,640, filed on Jul. 6, 2021, now Pat. No. 11,493,180.

(60) Provisional application No. 63/049,458, filed on Jul. 8, 2020.

(51) Int. Cl.
| | |
|---|---|
| *F21S 9/04* | (2006.01) |
| *F21S 9/02* | (2006.01) |
| *F21V 33/00* | (2006.01) |
| *F21S 8/08* | (2006.01) |
| *F21Y 115/10* | (2016.01) |
| *B01D 53/62* | (2006.01) |
| *B01D 53/82* | (2006.01) |
| *H10N 10/13* | (2023.01) |

(52) U.S. Cl.
CPC ........... *F21S 9/04* (2013.01); *B01D 53/62* (2013.01); *B01D 53/82* (2013.01); *F21S 8/085* (2013.01); *F21S 9/02* (2013.01); *F21V 33/006* (2013.01); *H10N 10/13* (2023.02); *B01D 2253/204* (2013.01); *B01D 2257/504* (2013.01); *F21Y 2115/10* (2016.08)

(58) Field of Classification Search
CPC ....... F21S 9/04; F21S 9/02; F21S 8/08; F21V 33/00; F21Y 115/10; F21L 13/00; F21L 13/02; F21L 4/08
See application file for complete search history.

(56) References Cited

U.S. PATENT DOCUMENTS

| | | | |
|---|---|---|---|
| 7,799,120 B2 * | 9/2010 | Yaghi ................ | B01J 20/226 95/91 |
| 2004/0124766 A1 * | 7/2004 | Nakagawa ......... | H10K 85/6574 313/506 |
| 2007/0178332 A1 * | 8/2007 | Ragini ............... | C09K 11/06 546/10 |

(Continued)

*Primary Examiner* — William J Carter
(74) *Attorney, Agent, or Firm* — McConnell Law Firm P.C.; Robert McConnell

(57) ABSTRACT

An adsorption bed utilizing Metal Organic Framework canisters to process flue gasses exiting from power generation plants. High temperature flue gas from a power generation is cooled and enters MOF containers where $CO_2$ is adsorbed. $CO_2$ is then de-adsorbed with additional high temperature flue gas. $CO_2$ is collected and removed from flue gas. Electricity is generated using the heat differential and collected to power the device. Electronic control system uses sensors and controls valves, pumps, cooling system and MOF gates.

17 Claims, 18 Drawing Sheets

(56) References Cited

U.S. PATENT DOCUMENTS

| | | | | |
|---|---|---|---|---|
| 2010/0012165 A1* | 1/2010 | Bedard | ................... | F21L 13/00 362/184 |
| 2014/0049950 A1* | 2/2014 | Vazquez | ................. | F21L 13/00 362/157 |

* cited by examiner

CLEANSING ADSORPTION BED UTILIZING METAL-ORGANIC FRAMEWORK

PRIORITY

This application claims priority to: 1) Provisional Patent Application Ser. No. 63/049,458 filed on Jul. 8, 2020 and 2) patent application Ser. No. 17/368,640 filed on Jul. 6, 2021, and is a Continuation-in-Part of patent application Ser. No. 17/840,912 filed on Jun. 15, 2022.

BACKGROUND OF THE INVENTION

Field of the Invention

The content of this patent application is directed to a novel device that utilizes the ability of Metal-Organic Framework (MOFs) to adsorb and desorb various gases, specifically $CO_2$, to produce heat, generate electricity from the produced heat and remove $CO_2$ from the atmosphere. Under certain temperature conditions, MOFs adsorb gases, in this case CO2, from the atmosphere. This adsorption process is exothermic, i.e., producing heat. The excess heat from this gas adsorption process, when applied to one side of a thermoelectric device, can be used to create a heat battery. The heat gradient created by this application of heat to the thermoelectric devices generates electrical current. This electrical current is used to power a LED lamp.

Under higher temperature conditions, MOFs desorb the adsorbed gas. This gas can be captured and stored in a storage cylinder. The stored gases can be permanently removed from the atmosphere, which is particularly helpful with $CO_2$.

DESCRIPTION OF BACKGROUND ART

Metal-Organic Framework (MOF) is a solid crystalline pores material with a well-defined structure and high surface area. Work in MOFs started in the 1990s and MOF development was led by Prof. Susumu Kitagawa (Kyoto University) and Prof. Omar Yaghi (UC. Berkeley).

Work on MOF's aimed at designing compounds possessing very large pores and high surface areas. Due to the ability to load gas molecules inside MOFs, wide applications of these devices are established.

The early development of MOFs aimed to achieve higher surface area as a solid pore crystalline material for gas storage application. However, with more investigation and discovery with MOFs, new applications have started to appear. Since the framework fixes the molecule in specific orientation, geometry, and spatial arrangement, the change we speak of can take place at a specific site (0D), along a certain path (1D), over molecules lying on a "flat" surface (2D), or over the entire crystal (3D)". Over time, the concept of "Water Harvesting" become attached to MOFs and more research supported the concept of producing water from air with low energy and high purity in a daily circulation base. Green energy applications such as capturing carbon dioxide and other contaminant opened a new window to use these materials in industry for gas purification. Moreover, MOFs have received attention in catalysis research either being used as support for nano-catalyst or creating open metal sites in the SBUs to act as catalysts. In addition, mechanochemical studies into MOFs shows their ability to absorb shockwaves in mechanical application due to the flexible features of the framework in some MOFs.

In addition to the major applications of MOFs described above such as catalysis, gas separation and gas capture/storage, MOFs also can be used as templates for growing uniform structure carbons and polymer material.

Thermoelectric generators are solid-state thermal motors consisting of two main junctions, known as P-type (elevated positive charge concentration) and N-type (elevated negative charge concentration). Essential concepts related to thermoelectric generators are the Seebeck effect and the Peltier effect. The Seebeck effect is the generation of electrical voltage (current) in a curve consisting of two kinds of materials that are connected to a hot junction on one side and a cold junction on the other side. The temperature gradient creates the charge flow. The two dissimilar metals connected to form two junctions (curve) is called a thermocouple. On the other hand, the Peltier effect creates a temperature difference by applying a voltage between two electrical junctions connected to a semiconductor. The Peltier effect is used for cooling. These two effects are the inverse of the other.

Prior art patents in this area describe the use of MOFs to harvest water from the atmosphere but do not describe using heat generated in this process to generate electricity or light.

The following technical references are provide additional detail related to MOFs and thermoelectrics, and are herein incorporated by reference:

V. Blay, L. F. Bobadilla and A. Cabrera-Garcia, Zeolites and Metal-Organic Frameworks From Lab to Industry, Amsterdam: Amsterdam University Press., 2018.

Jianwei Renab, "Structural defects in metal—organic frameworks (MOFs): Formation, detection and control towards practices of interests," Coordination Chemistry Reviews, vol. 349, no. 15 October, pp. 169-197, 2017.

Nathaniel L. Rosi, "Hydrogen Storage in Microporous," Science, vol. 300, no. 5622, pp. 1127-1129, 2003.

Omar M. Yaghi, Introduction to Reticular Chemistry: Metal-Organic Frameworks and Covalent Organic Frameworks, Weinheim, Germany: Wiley-VCH, 2019.

Meili Ding, "Carbon capture and conversion using metal—organic frameworks and MOF-based materials," Chemical Society Reviwes, vol. 48, no. 10, pp. 2783-2828, 2019.

David Britt, "Highly efficient separation of carbon dioxide by a metal-organic framework replete with open metal sites," PNAS, vol. 49, no. Decemper 8, pp. 20637-20640, 2009.

O. M. Yaghi, "Reticular Chemistry in All Dimensions," ACS Central Science, vol. 5, no. 8, pp. 1295-1300, 2019.

Nikita Hanikel, "Rapid Cycling and Exceptional Yield in a Metal-Organic Framework Water Harvester," ACS Central Science, vol. 5, no. 10, pp. 1699-1706, 2019.

Xuan Zhou, "Shock Wave Energy Absorption in Metal-Organic Framework," Journal of the American Chemical Society, vol. 141, no. 6, pp. 2220-2223, 2019.

Pascal G. Yot, "Metal—organic frameworks as potential shock absorbers: the case of the highly flexible MIL-53 (AI)," Chemical Communications, vol. 50, no. 67, pp. 9462-9464, 2014.

Young, Christine, et al. "Controlled Chemical Vapor Deposition for Synthesis of Nanowire Arrays of Metal-Organic Frameworks and Their Thermal Conversion to Carbon/Metal Oxide Hybrid Materials." Chemistry of Materials, vol. 30, no. 10, 2018, pp. 3379-3386., doi:10.1021/acs.chemmater.8b00836.

Youn, Han-Kyol, et al. "MWCNT Synthesis over Fe-BTC as a Catalyst/Carbon Source via CVD." Materials Letters, vol. 65, no. 19-20, 2011, pp. 3055-3057., doi:10.1016/j.matlet.2011.06.081.

Day, Robert W., et al. "Single Crystals of Electrically Conductive Two-Dimensional Metal-Organic Frameworks: Structural and Electrical Transport Properties." ACS Central Science, vol. 5, no. 12, October 2019, pp. 1959-1964., doi:10.1021/acscentsci.9b01006

Liu, Y., Guo, J., Zhu, E., Liao, L., Lee, S., Ding, M., . . . Duan, X. (2018). Approaching the Schottky—Mott limit in van der Waals metal—semiconductor junctions. Nature, 557(7707), 696-700. doi:10.1038/s41586-018-0129-8

Liu, Teng, et al. "Self-Sacrificial Template-Directed Vapor-Phase Growth of MOF Assemblies and Surface Vulcanization for Efficient Water Splitting." Advanced Materials, vol. 31, no. 21, October 2019, p. 1806672., doi:10.1002/adma.201806672.

Yang, Hui, et al. "Metal-Organic Framework Nanocrystals as Sacrificial Templates for Hollow and Exceptionally Porous Titania and Composite Materials." Inorganic Chemistry, vol. 54, no. 19, 2015, pp. 9483-9490., doi: 10.1021/acs.inorgchem.5b01352.

Omar M. Aghi, Introduction to Reticular Chemistry, Weinheim: Wiley-VCH, 2019.

Y. Peng, "Application of Nanotechnology in Pollution Control of NOx From Stationary Sources," in Nanomaterials for the Removal of Pollutants and Resource Reutilization, Elsevier, 2019, pp. 179-211.

J. B. Condon, "Chapter 2—Measuring the Physisorption Isotherm," in Surface Area and Porosity Determinations by Physisorption, Elsevier Science, 2006, pp. 29-53.

Brief History of Thermoelectrics. (n.d.). Retrieved from http://thermoelectrics.matsci.northwestern.edu/thermoelectrics/history.html Moore, J. W., & Stanitski, C. L. (2015). Chemistry: The molecular science. Stamford, CT: Cengage Learning.

Lee, S., Bock, J. A., Trolier-Mckinstry, S., & Randall, C. A. (2012). Ferroelectric-thermoelectricity and Mott transition of ferroelectric oxides with high electronic conductivity. Journal of the European Ceramic Society, 32(16), 3971-3988. doi:10.1016/j.jeurceramsoc.2012.06.007

Charles A. Domenicali. Irreversible thermodynamics of thermoelectric effects in inhomogeneous, anisotropic media. Phys. Rev., 92:877-881, November 1953.

OBJECTS OF THE INVENTION

It is an object of the invention to use MOFs to adsorb $CO_2$ from the atmosphere.

It is an object of the invention to utilize the heat generated by the $CO_2$ adsorption process to create a heat gradient on a thermoelectric device.

It is an object of the invention to utilize the heat gradient created on the thermoelectric device to generate electrical current.

It is an object of the invention to use the generated electrical current to power an LED light fixture.

It is an object of the invention to capture $CO_2$ desorbed from the MOF material in a gas capture cylinder.

It is an object of the invention to provide a MOF container with MOF tunnels that fits within a canister.

It is an object of the invention to fill the MOF tunnels with powdered MOF material.

It is an object of the invention for the canister to have a gate at one end that opens and closes with a servo motor depending on the ambient temperature.

It is an object of the invention for the canister to be made of heat conductive material and have thermoelectric devices attached to the outer surface of the canister in a manner that heat is effectively conducted to one side of the thermoelectric device.

It is an object of the invention for the thermoelectric devices to be wired to connect to an LED light fixture.

It is an object of the invention for the canister to be connected via a pipe and a pump to a gas storage cylinder.

It is an object of the invention for the $CO_2$ gas desorbed from the MOF to be captured and stored a gas storage cylinder.

It is an object of the invention to use MOF cannisters to create an $CO_2$ adsorption bed for use in power generation plants.

It is an object of the invention to use MOF devices to remove $CO_2$ from flue gas.

It is an object of the invention to use the heat of adsorption to generate electricity.

It is an object of the invention to use the heat of hot flue gas to start a desorption process.

It is an object of the invention to store desorbed $CO_2$ in a gas storage tank.

SUMMARY OF THE INVENTION

The present invention relates to an adsorption bed utilizing Metal-Organic Framework (MOF) devices to remove $CO_2$ from flue gas exiting a power generation plant. The adsorption bed includes a MOF canister comprising a MOF container comprised of a plurality of MOF tunnels, each MOF tunnel containing a powdered MOF material, a gate, and a plurality of thermoelectric devices.

Below a certain adsorption activation temperature, the MOF material adsorbs a gas in this case $CO_2$. The MOF material is chosen so adsorption activation temperature is generally consistent with the temperatures related to the exiting flue gas. The adsorption process is exothermic and generates heat. Above a certain desorption activation temperature the MOF desorbs $CO_2$, releasing it out of the MOF material. The present invention uses the heat from the adsorption to generate electrical current. The present invention further uses the desorption to capture specific gases and remove them from the atmosphere.

The MOF container is sized to fit within the canister and is further comprised of MOF tunnels containing a powdered MOF material. The canister has a gate at one end and valves at the other. The gate is opened and closed by a servo motor based on the control system. The canister is made from a strong heat conducting metal and has thermoelectric devices arrayed on the exterior. Below the adsorption activation temperature, the gate is open, thus exposing the MOF material to the ambient atmosphere. The specific gas, in this case $CO_2$, is adsorbed into the MOF material, generating heat. This heat is applied to a thermoelectric device to generate electrical current.

Above the desorption activation temperature, the gate closes and forms a gas-tight seal. The specific gas, in the preferred embodiment, $CO_2$, is desorbed. The gas is captured in the canister and pumped out of the valve, through piping and into a gas storage cylinder. The present invention enables removal of $CO_2$ from the flue gas exiting power plants utilizing fossil fuels.

DETAILED DESCRIPTION OF THE INVENTION

The following detailed description outlines the preferred embodiment of the claimed invention. There may be many other configurations that comport with the attached claim language and this description is in no way limiting to the scope of the invention.

The design of the disclosed invention uses the enthalpy of adsorption in MOFs in combination with thermoelectric devices to produce electricity for the lamp. A further feature of the invention is the ability to capture $CO_2$ or $H_2O$ vapor from the ambient air. This is achieved by selecting a specific adsorption material that captures one of these two gaseous compounds.

Figure 1:
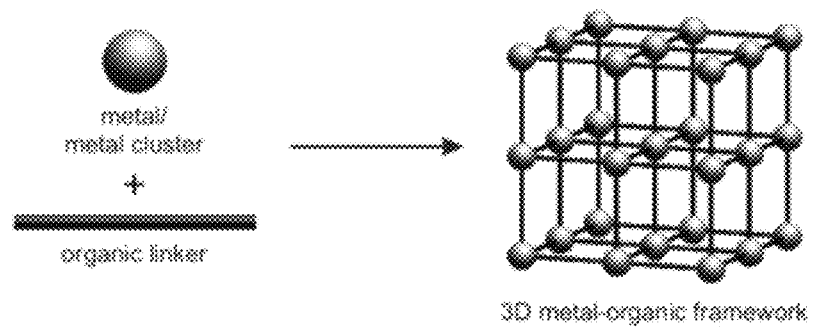
FIG. 1 shows a 3D metal-organic framework.

Metal-Organic Framework (MOF) is a solid crystalline pores material with a well-defined structure and high surface area. Work in MOFs started in the 1990s and MOF development was led by Prof. Susumu Kitagawa (Kyoto University) and Prof. Omar Yaghi (UC. Berkeley). FIG. 1 shows how MOFs are constructed by joining metal units with organic linkers, using coordination bonds to create open crystalline frameworks with permanent porosity.

Work on MOF's aimed at designing compounds possessing very large pores and high surface areas. Due to the ability to load gas molecules inside MOFs, wide applications of these devices are established. One of the early examples of Metal-Organic Framework is MOF-5 which is a Zirconium based framework (Cluster:$[OZn_4(CO_2)_6]$) with benzene rings as the organic linkers(1,4-benzenedicarboxylate) resulting in a high surface area of 2500 $m^2g^{-1}$. Beside many other criteria during the reaction, changing the Metal or changing the organic linker is the main controlling tools to create new structures.

The synthesis of MOFs starts by synthesising the organic linker according to the targeted structure of functional groups needed in the framework. Using solvothermal reaction is the common method of synthesising the MOF. Synthesis starts with dissolution of both the organic linker and metal salt in amide-based solvents. Sometimes, adding a second solvent is needed to help solubilizing and controlling the reaction. The final step is to heat the mixture to lower than the boiling point of the solvents where at high temperatures and over a long period, both solvents (such as: N,N-dimethylformamide and formic acid) work to allow the cabling between the linker and metal cluster to build and grow the crystals. Time, temperature, solvent concentration and source of the metal are important factors which led to variety of final MOF results such as: powder MOF, nano-MOF, and a single crystal MOF depending on the application desired. Variance of different factors can result in different topology. Other methods are under development for the free-solvent synthesis of MOFs using other techniques to scale up the production of MOFs.

Figure 2:
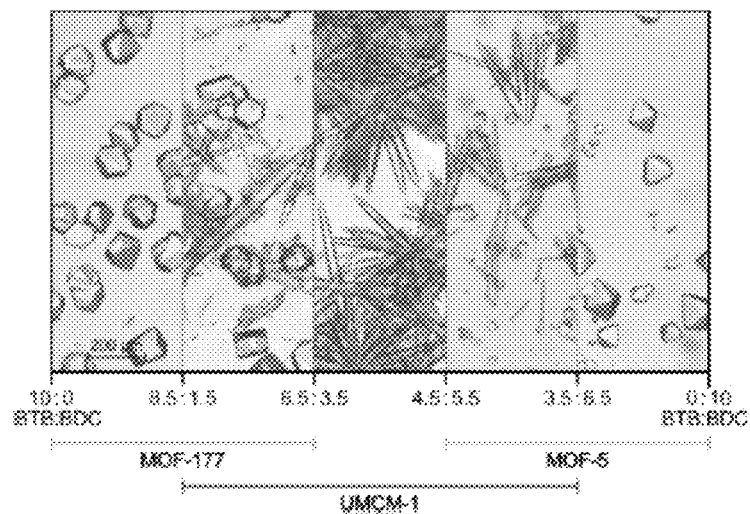
FIG. 2 shows the effect of different ratio between the two linkers in in producing different structures and properties.

Another approach for improving the MOF is post-synthesis modification (PSM) performed by introducing a new functional group to the existing structure while maintaining desired properties of the MOF. PSM enables improving the chemistry of the framework whether by adding the new functional group to the Secondary Building Unite (SBU) or the Organic linker. Moreover by PSM, the metal used in the MOF can be changed by exchanging the metal in the SBU. Secondary Building Unite is a term used in MOFs to represent the inorganic building block of the structure (polynuclear clusters of metal ions). Multivariate (MTV) MOFs is a concept refer to the creation of complex and heterogeneous structure by produce a mixed linker (more than one linker in the same MOF) or mixed metal framework. FIG. 2 shows the effect of different ratio between the two linkers in in producing different structures and properties.

MOFs are solid pore crystalline and are made up of organic and inorganic components, thus requiring different techniques for characterization. One of the basic techniques is x-ray diffraction either using the powder or single crystal techniques. Both techniques are fundamental in defining the crystallinity and the properties of the structure. In terms of investigating the porosity of the MOF, Gas Adsorption Isotherm is used which provides information about surface area and heat of adsorption of the MOF. Furthermore, the dynamic adsorption capacity of MOFs is analysed by using a breakthrough setup. Other essential equipment for analysing the MOFs include: FT-IR, TGA, ICP-MS, UV-vis, SEM, TEM and NMR.

The early development of MOFs aimed to achieve higher surface area as a solid pore crystalline material for gas storage application. However, with more investigation and discovery with MOFs, new applications have started to appear. Since the framework fixes the molecule in specific orientation, geometry, and spatial arrangement, the change we speak of can take place at a specific site (0D), along a certain path (1 D), over molecules lying on a "flat" surface (2D), or over the entire crystal (3D)". Over time, the concept of "Water Harvesting" become attached to MOFs and more research supported the concept of producing water from air with low energy and high purity in a daily circulation base. Green energy applications such as capturing carbon dioxide and other contaminant opened a new window to use these materials in industry for gas purification. Moreover, MOFs have received attention in catalysis research either being used as support for nano-catalyst or creating open metal sites in the SBUs to act as catalysts. In addition, mechanochemical studies into MOFs shows their ability to absorb shockwaves in mechanical application due to the flexible features of the framework in some MOFs.

In addition to the major applications of MOFs described above such as catalysis, gas separation and gas capture/storage, MOFs also can be used as templates for growing uniform structure carbons and polymer material.

Figure 3:
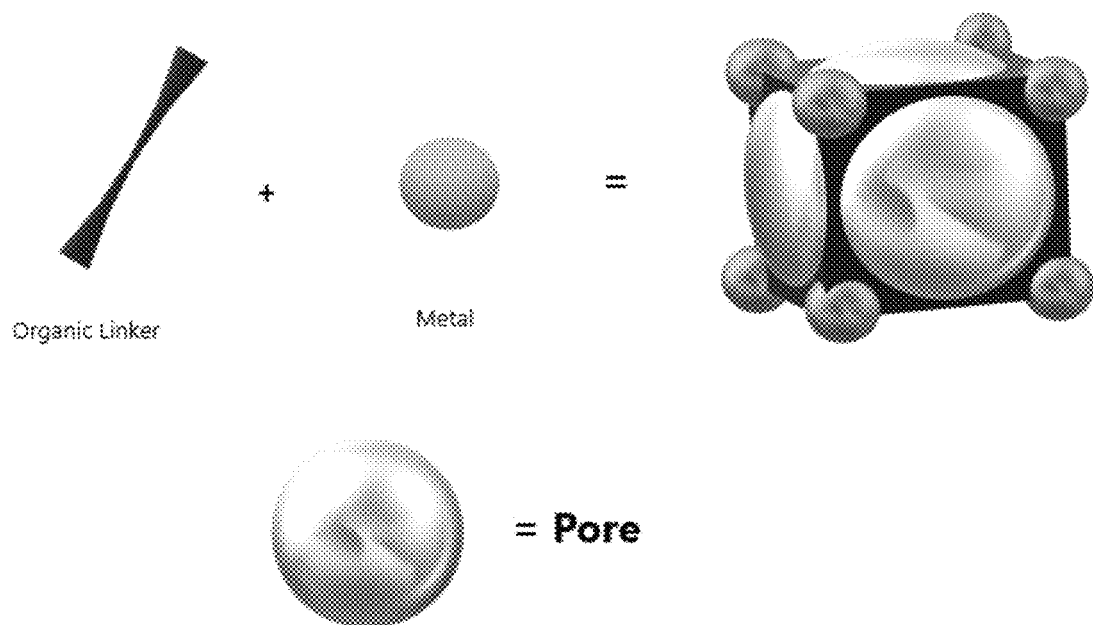
FIG. 3 shows a view of the MOF with the organic linker, the metal and the pore.

Crystallin pore solid material is a class of material that already exist in nature, an example of which is Zeolites. With further scientific research, other similar materials have been developed such Metal-Organic-Framework and Covalent-Organic-Framework. These materials (MOFs, COFs and Zeolites) are unique because of their rigid structure (crystals) that also includes pores making them like sponges, but in nanoscale. In Zeolites and MOFs the structure are consist of two building blocks: the metal and the organic linker. Contrast that with COFs, that include only organic compounds without metal involvement in the basic structure. FIG. 3 shows a view of the MOF with the organic linker, the metal and the pore.

The existence of the pores allows the structure to adsorb or store another species, especially those in gas phases such as $CO_2$, $H_2O$ and $CH_4$. This adsorption process is categorized into different type of adsorptions depending on the bonds between the adsorbate and the adsorbent. The adsorption can be categorized into these two types: physisorption or chemisorption that depends on the interaction forces (Van-der-Waals, ionic, covalent or metallic) present between both the adsorbate and the adsorbent. Physisorption or van-der-Waals adsorption is an exothermic process, generating heat, while creating weak intermolecular binding forces. These weak forces allow MOFs to adsorb different gases and enables an easier Adsorption-Desorption process. The heat associated with adsorption of a gas into solid pores material is referred to as isosteric heat of adsorption or the enthalpy of adsorption which depends on the adsorbent, the gas to be adsorbed and other related criteria including pressure and temperature.

When the adsorption process of certain gases occurs, an equal amount of energy (usually in the form of heat) must be applied as in the enthalpy of adsorption to release the gas adsorbed in the solid framework and to achieve the Adsorption-Desorption cycle of that gas. For applications such as gas separation or gas storage, a low enthalpy of adsorption is preferable to minimize the energy input needed to extract the gas out of the framework. The goal for these applications is to achieve higher capacity for the adsorbate with lower enthalpy of adsorption making it possible to store more gas while utilizing less energy when extracting it, thus resulting in lower costs.

For purposes of this patent application, the temperature at which gas adsorption or desorption starts in an MOF is the activation temperature. The specific temperature where gas adsorption begins is the adsorption activation temperature. The specific temperature where gas desorption begins is the desorption activation temperature. The MOF material chosen for the present lighting device should have an activation temperature that is near the ambient nighttime temperature of the area where the light is used. The adsorption activation temperature should be somewhere between the average ambient daytime temperature and the average ambient nighttime temperature such that gas adsorption for the MOF occurs in the night time hours and gas desorption occurs during daylight hours.

Figure 4:
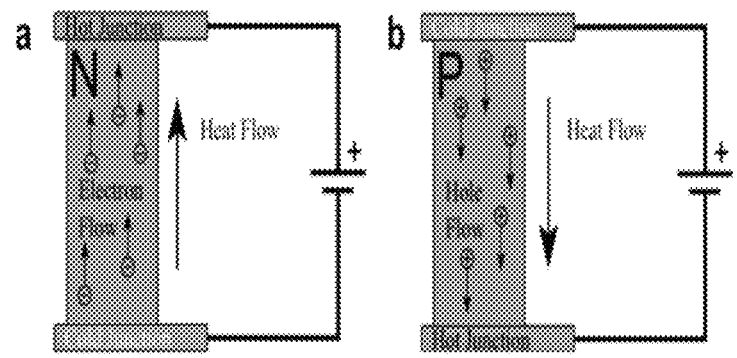
FIG. 4 shows n-type versus p-type Peltier elements.

Thermoelectric generators are solid-state thermal motors consisting of two main junctions, known as P-type (elevated positive charge concentration) and N-type (elevated negative charge concentration). The P-type components are doped to have a large number of positive charges or holes. The N-type components are doped to contain a large level of negative charges or electrons. When there is an electrical connection between the P-type element and the N-type element, an electron from the N-type moves to the P-type material for each hole that migrates to the N-type material. FIG. 4 shows electron and hole flow from a hot junction to a cold junction in a thermoelectric generator.

Figure 5:
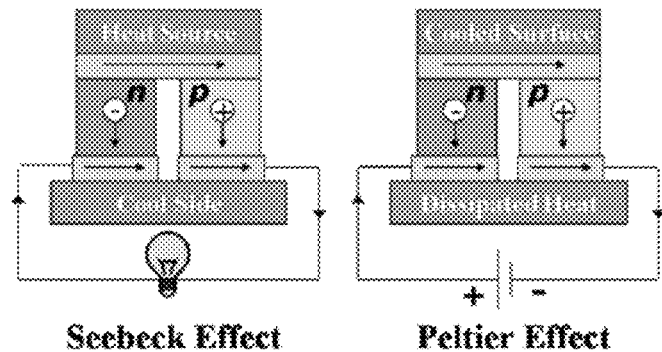
FIG. 5 shows a demonstration of the Peltier effect and the Seebeck effect.

Essential concepts related to thermoelectric generators are the Seebeck effect and the Peltier effect. The Seebeck effect is the generation of electrical voltage (current) in a curve consisting of two kinds of materials that are connected to a hot junction on one side and a cold junction on the other side. The temperature gradient creates the charge flow. The two dissimilar metals connected to form two junctions (curve) is called a thermocouple. On the other hand, the Peltier effect creates a temperature difference by applying a voltage between two electrical junctions connected to a semiconductor. The Peltier effect is used for cooling. These two effects are the inverse of the other. FIG. 5 shows diagrams of the Seebeck Effect and Peltier Effect in operation.

Figure 6:
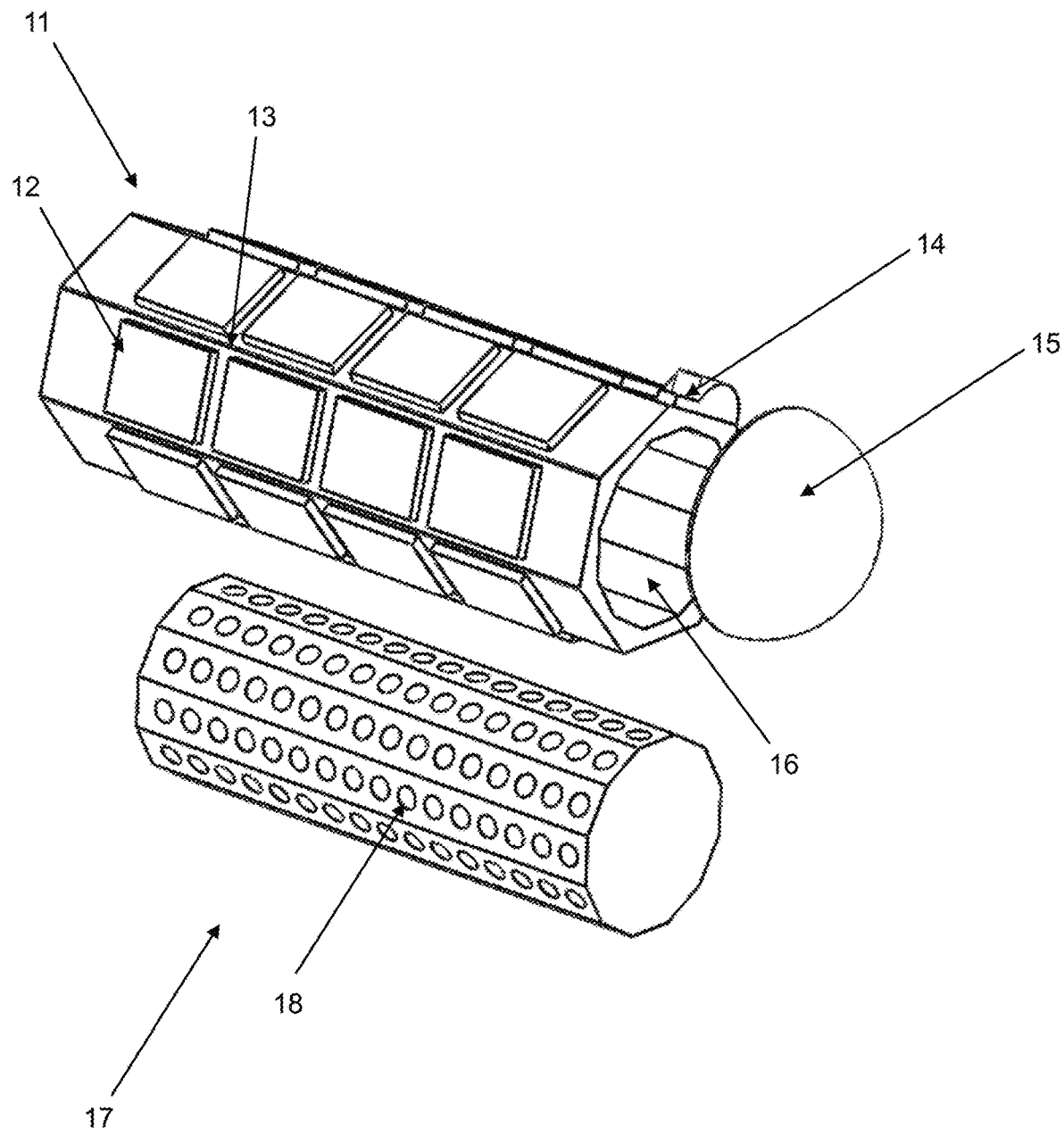
FIG. 6 shows a complete view of the canister and MOF container.

FIG. 6 shows a view of the canister 11 of the present invention with MOF container 17 removed from the interior of the canister. The canister further includes thermoelectric devices 12 arrayed around the exterior of the canister, wiring 13 connecting the thermoelectric devices to the lighting device in series, gate 15 and gate motor 14. MOF container 17 is shown removed from the canister 11. MOF container 17 is comprised of a plurality of MOF tunnels 18 that each store the MOF material for the device.

Canister 11 is made from a thin layer of heat conductive metal. In the preferred embodiment of the invention, aluminum (Al) or copper (Cu) are used, but other suitable heat conductive metals, or other heat conductive materials may be used. The walls of the canister are machined to be as thin as possible in order to effectively conduct heat generated by the MOF material to the thermoelectric devices. Canister 11 can be machined in any suitable machine shop to the desired radius and wall thickness.

Thermoelectric devices 12 generate electricity from the heat output by the exothermic adsorption process of carbon dioxide by the MOF in the MOF container 17. As described above and below, the under certain temperature conditions, the MOF material in MOF container 17 adsorbs carbon dioxide ($CO_2$). Heat is a byproduct of this adsorption process and this heat is utilized by thermoelectric devices 12 to generate electricity to power the light. Because of the highly heat conductive design of canister 11, the maximum amount of heat is conducted to the thermoelectric devices 12 in order to generate the maximum amount of electricity. These thermoelectric devices 12 are Peltier type devices and in the preferred embodiment are HiLetGo Semiconductor Refrigeration Tablets TEC1-12706 12V 6 A Heatsink Thermoelectric Cooler Cooling Peltier Plate Module in a 40×40 MM size. While the above mentioned devices are used in the preferred embodiment, a variety of thermoelectric devices, of both Peltier and Seebeck variety, are suitable for this invention. The thermoelectric device utilized depends on the characteristics of the MOF material, the temperature at which adsorption and desorption occurs and the specific gas desorbed by the device.

In the preferred embodiment, 12 of these devices are installed on the exterior of canister 11. One side of the device is glued to the canister and the other side is exposed to the open air. Contact cement adhesive, as sold by Loctite brand, is applied around the edges of thermoelectric device to adhere them to the outside of the canister 11. The adhesive is applied in a way to allow maximum surface area of the thermoelectric device to be in direct contact with the metal canister 11 for maximum heat conduction and thus electricity generation. Wires 13 are connected to each of the thermoelectric devices and connected in series to the LED lighting circuit.

Gate 15 allows the interior of canister 11 to be opened or closed to ambient air. Gate 15 is normally open at low temperatures, generally at nighttime, allowing cool air to flow into the MOF material contained in the MOF container 17. In the preferred embodiment, an MOF material is chosen with an adsorption activation temperature that aligns with the ambient nighttime temperature so that during the cool temperature cycle at night, the MOF material adsorbs $CO_2$. The material is also chosen to have a desorption activation temperature that aligns with the ambient daytime temperature, so $CO_2$ is desorbed from the MOF material during daylight hours. Gate 15 is open at temperatures below the adsorption activation temperature of the MOF materials (generally at night). Gate 15 is closed above the desorption activation temperature of the MOF material, which generally occurs during the day. Gate 15 includes a gasket ring to seal the desorbed gas in the canister 11 such that it can be pumped out and stored. The gate 15 is made of the same material as the canister 11, generally a thin metal with good heat conduction such as aluminum or copper. The opening and closing of gate 15 is controlled by gate motor 14. Gate motor 14 is a low power electric servo motor powered by electricity generated by the device, of a type well known in the art, that opens and low nighttime temperatures and closes during higher day time temperatures. Gate motor 14 includes a temperature sensor that controls the opening and closing of the gate. Gate motor 14 opens gate 15 at the adsorption activation temperature of the MOF material and keeps gate 15 open whenever the temperature is below that temperature. Gate motor 14 closes gate 15 whenever the ambient temperature reaches the desorption activation temperature and keeps gate 15 closed until the temperature drops below the desorption activation temperature.

MOF container 17 contains a plurality of MOF tunnels 18 that contain MOF material. MOF container 17 is machined out of a similar heat conductive material as canister 17 such as aluminum or copper. MOF container 17 can be machined in a suitable machine shop to create the canister and MOF tunnels 18 of suitable size. MOF container 17 is removable from canister 11 so that MOF material can be inserted into the MOF tunnels 18.

MOF tunnels 18 contain the MOF material selected for the present invention. In the preferred embodiment, powder MOF sold under the tradename Basolite™ is used. MOFS is chosen for $CO_2$ capture and replace cycle, though other types of MOFs can be used such as MOF74. MOFS and MOF74 are the two main MOF crystal powders that are sold significant quantities for adsorbing $CO_2$, but other specialty MOFs can be synthesized. The activation temperatures for MOFS and MOF74 align well with daytime and nighttime temperatures in many global locations.

Choosing the specific MOF depends on the amount of heat generated to be generated by the adsorption process and the design of the battery. For example, for maximum heat output, Co-MOF74 should be selected. Co-MOF74 will generate a large amount of heat during the adsorption process. However, during the daytime desorption process, there must be enough ambient daytime heat in the geographic location to release the gases trapped inside the MOFs. In cooler climates, much closer to the normal, MOF5 would be suitable. It produces lower heat levels during the nighttime adsorption process, but also requires less heat during the daytime desorption cycle to release the gas. This approach requires more MOF material in the battery and choice of a thermoelectric device with a lower temperature gradient.

The choice of MOF material is a design choice based on the system requirements for the ambient temperatures in the geographic location of the lamp and battery. While some families of MOF74 have a lower heat of adsorption than MOF5 but most of them have higher heat of adsorption, similar to Co-MOF74. Co-MOF74 is best suited for warm climates and MOF5 works best for climates with cooler average daytime temperatures.

Figure 7:
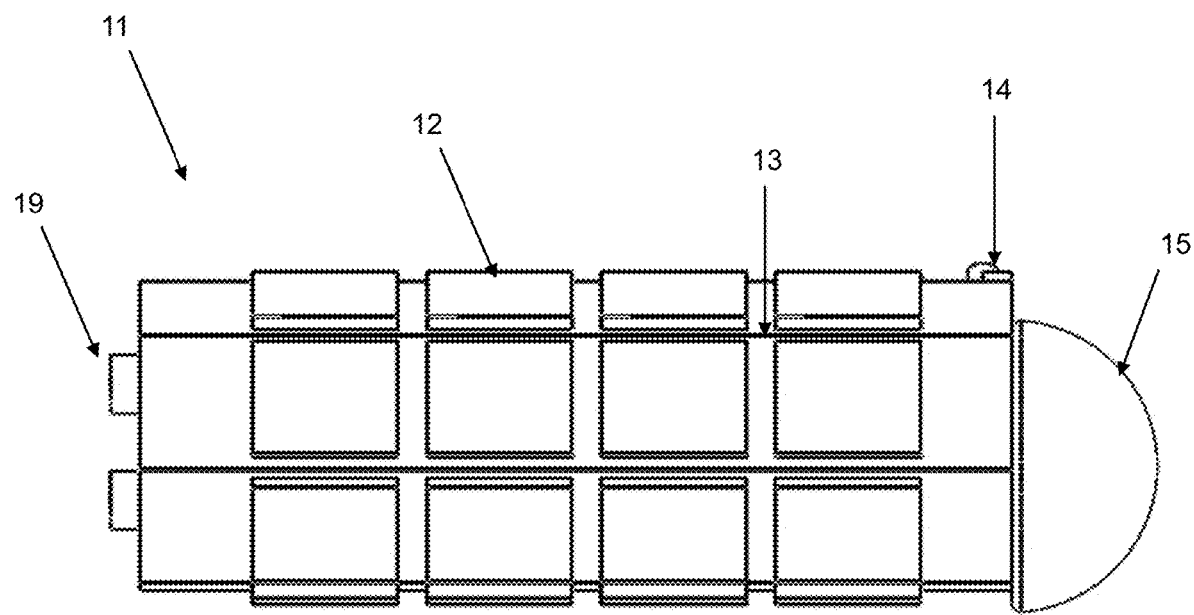
FIG. 7 shows a side view of the canister with the gate closed.

FIG. 7 shows a side view of canister 11 with thermoelectric devices 12, wiring 13, gate 15 (in the closed position) and gate motor 14. Additionally the external portion of valves 19 that are used for connecting the pipes for the desorbed $CO_2$ gas produced by the device. The pipes connected to valves 19 are connected to the pump and storage tank shown in later figures.

Figure 8A:
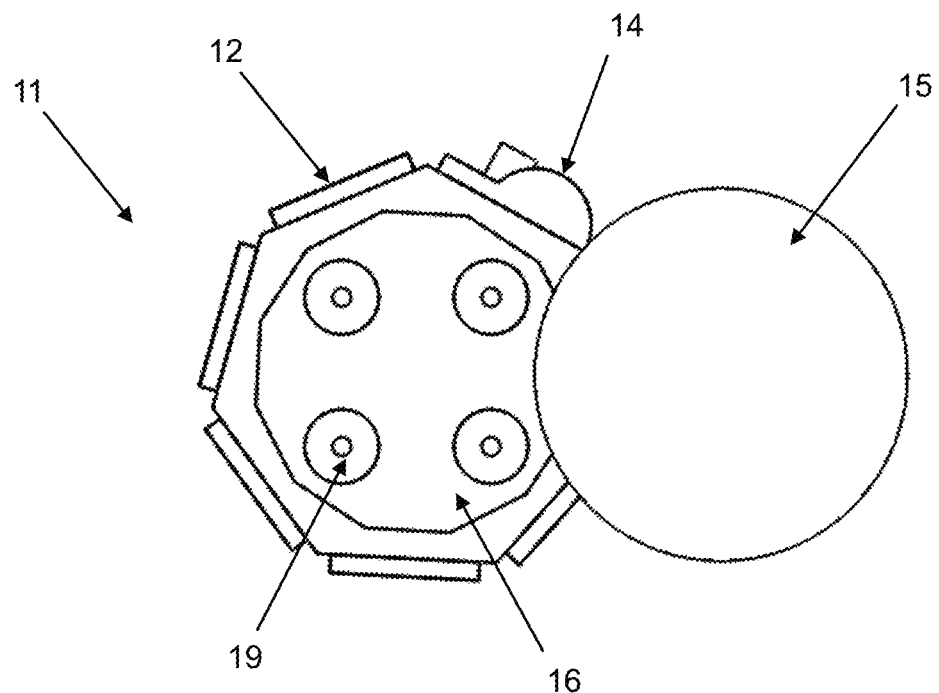
FIG. 8a shows an end view of the canister with the gate open.

FIG. 8a shows an end view of canister 11 with gate 15 in the open position. Canister cavity 16 is shown without the MOF container 17 and with the internal portion of valves 19 shown.

Figure 8B:
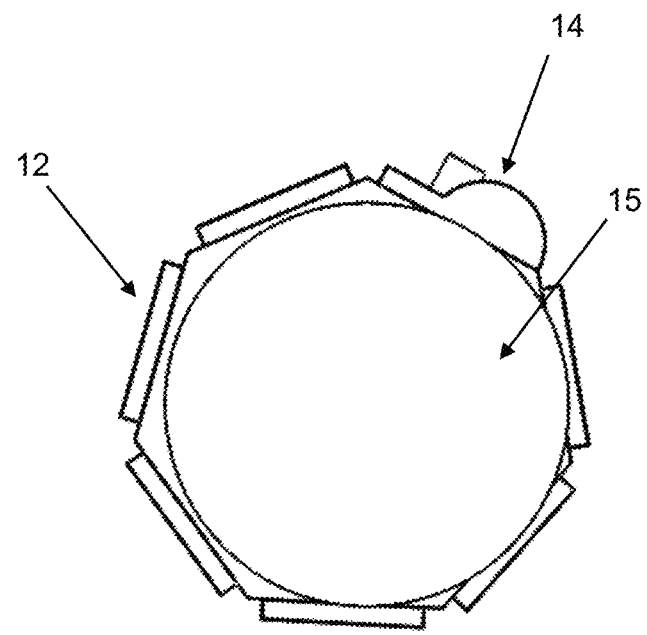
FIG. 8b shows an end view of the canister with the gate closed.

FIG. 8b shows the end view of the canister 11 with the gate 15 in the closed position.

Figure 9:
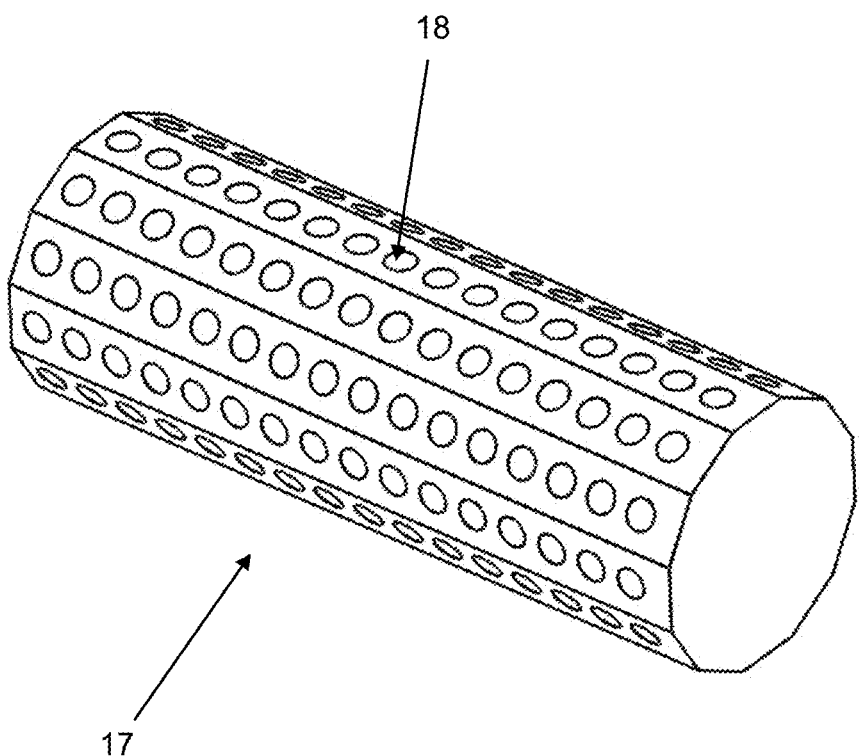
FIG. 9 shows a view of the MOF container.

FIG. 9 shows a view of the MOF container 17 with the MOF tunnels 18 visible on the surface. The powdered MOF material used for the device is placed in MOF tunnels 18. MOF container 17 fits in canister cavity 16 such that gate 15 can open and close with it in place. The canister 11 is mounted to the lamp pole (discussed below) at a 30° angle (with the gate higher than the end with the gas pipes), which helps the MOF material stay within the MOF tunnels and in the canister.

Figure 10:
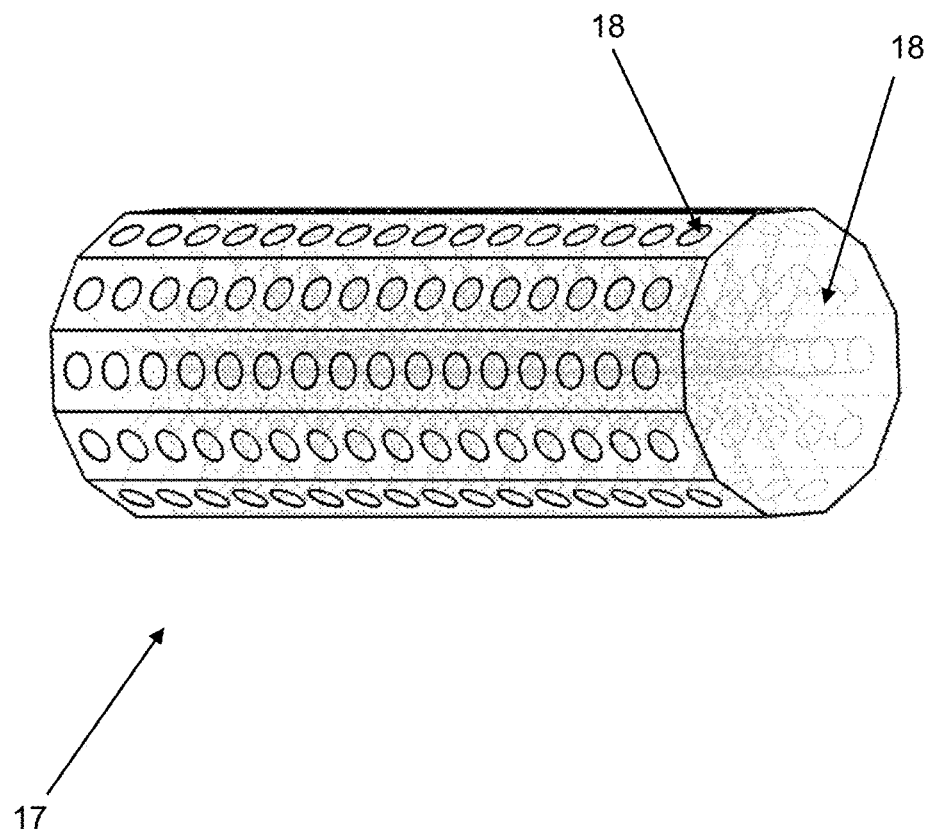
FIG. 10 shows a view of the MOF container with MOF tunnels visible.

FIG. 10 shows a view of the MOF container 17 where the MOF tunnel 18 is visible from the exterior of the MOF container 17 and the length of MOF tunnel 18 in the interior of the MOF container is shown from in a side view.

Figure 11:
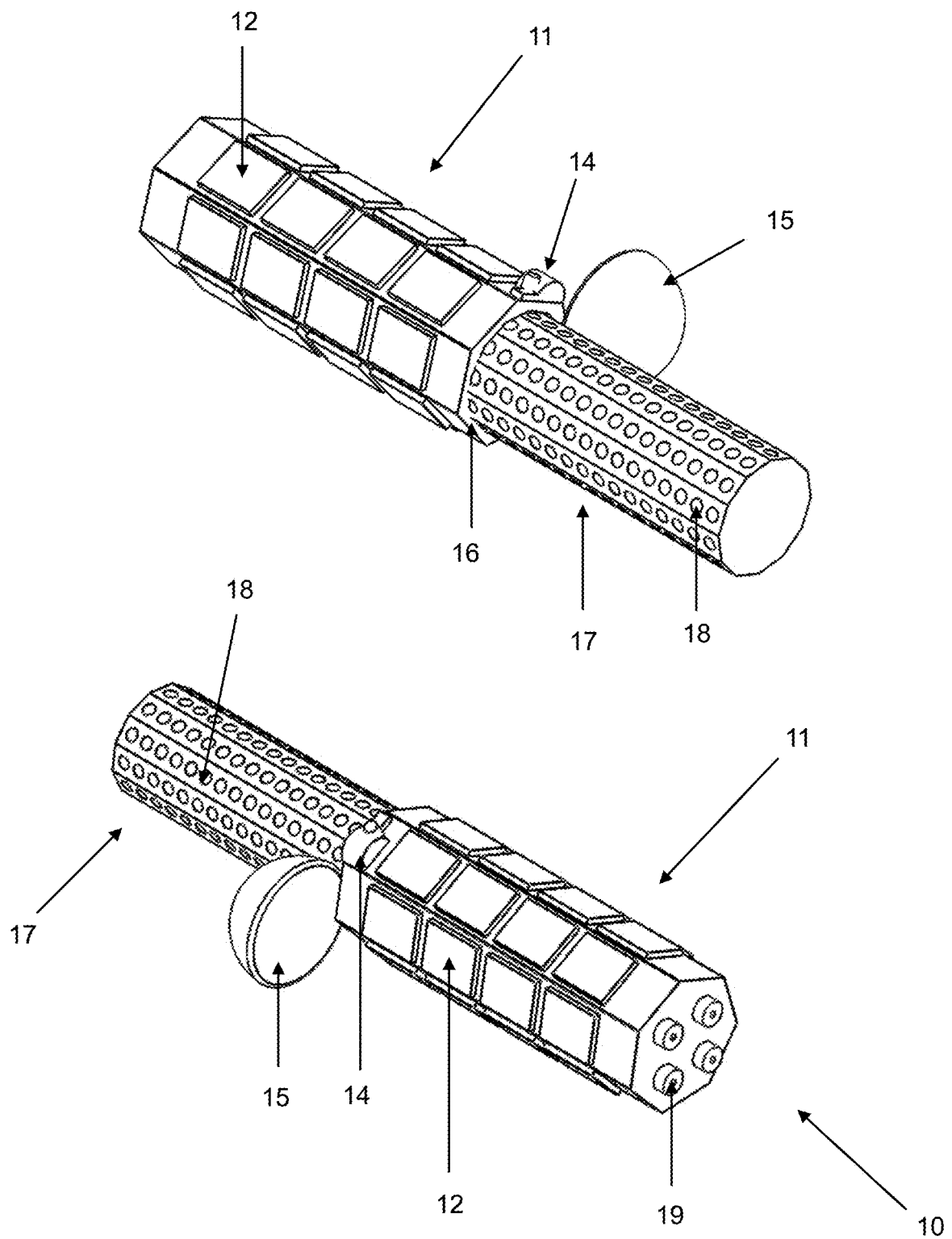
FIG. 11 shows two views of the canister with the MOF container being inserted.

FIG. 11 shows a view of both sides of canister 11 with MOF container 17 being inserted in canister cavity 16. The MOF canister 17 can be removed from the canister to insert MOF material. It is placed fully within the canister such that the gate 15 may open and close fully. In the lower view, valves 19 for connection to pipes are visible. The canister 11 is mounted to the lamp pole (discussed below) at a 30° angle (with the gate higher than the end with the gas pipes), which helps the MOF material stay within the MOF tunnels and in the canister.

Figure 12:
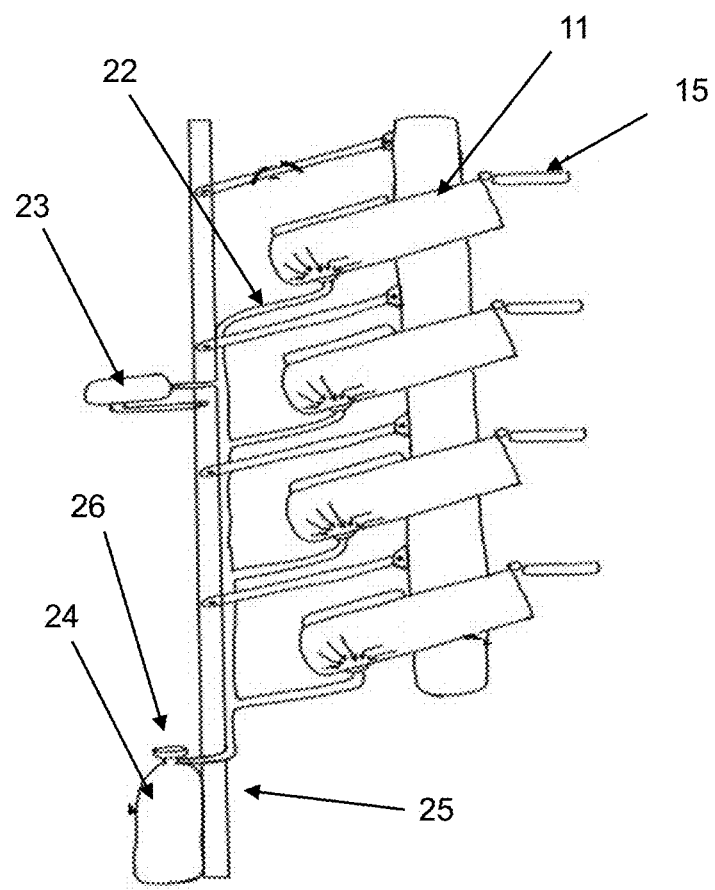
FIG. 12 shows a first embodiment of the complete LED light system.

FIG. 12 shows a view of the complete lamp apparatus. LED lamp 23 and a plurality of canisters are attached to lamp post 25. The top of lamp post 25 is tilted at a 30° angle. Canister 11 is connected to the light pole using metal glue in the preferred embodiment, with the canister 11 also angled at 30°. Each canister 11 is connected via pipes 22 to storage cylinder 24. In the preferred embodiment, pipe 22 is 2 m silicon tubing, but any gas tight flexible pipe or tubing could be substituted. The pipes 22 are sealed to the rear of the canister with vacuum glue. A standard metal scuba style 13 cubic foot aluminum tank is suitable for this purpose but any storage tank or cylinder suitable for gas storage would be appropriate. Pipes 22 are connected to pump 26 using vacuum glue. Pump 26 moves desorbed gas from canister 11 to storage cylinder 24. Pump 26 is an electric battery powered pump. A lower miniature vacuum pump, as well known in the art, is suitable for this purpose. Wires 13 (not shown) connect the thermoelectric devices, which generate electricity from heat generated in the canister 11, to the LED light 23.

LED light 23 is comprised of a circuit board with a row of LEDs mounted to the underside. The number of LEDs is dependent on the amount of light to be generated and the amount of available electrical current from the thermoelectric devices. LEDs for the device should be waterproof but the color, intensity and electrical characteristics chosen based on desired output from the light fixture. The electrical circuit board is well known in the art, with the LEDs soldered in parallel to the board using techniques well known in the art.

Figure 13:
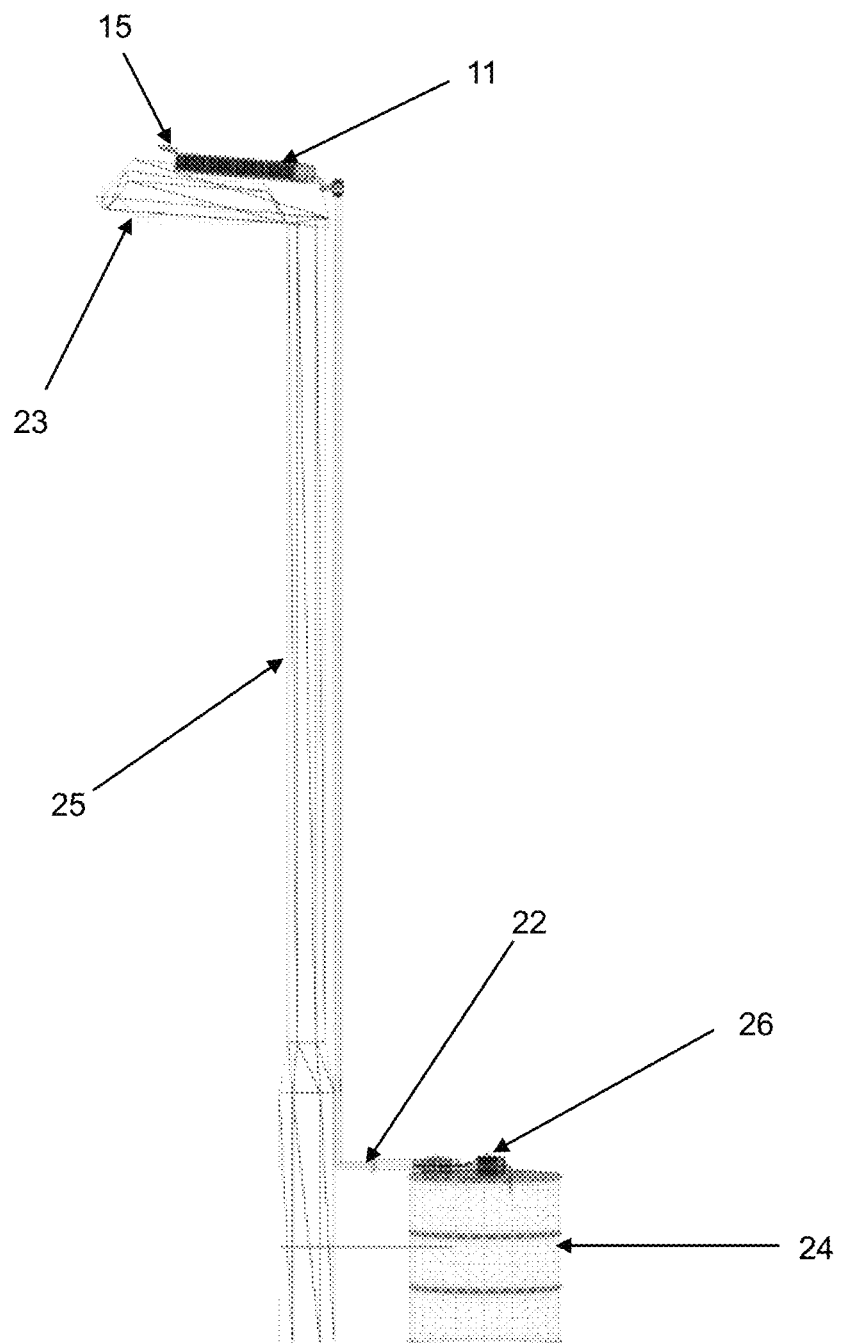
FIG. 13 shows a second embodiment of the complete LED light system.

FIG. 13 shows an alternative view of the complete lamp apparatus. The components are attached and connected in similar means to FIG. 12 but in a slightly different configuration. In this embodiment, LED lamp 23 and canister 11 are attached at the top of lamp post 25. Gate 15 opens and closes depending on the ambient temperature. The gate closes when the MOF material contained within the canister desorbs the adsorbed gas, so it can be captured and removed from the atmosphere. Pipe 22 is connected to the canister 11 at one end with pump 26 and storage cylinder 24 connected at the opposite end of the pipe. Pump 26 moves the desorbed gas from canister 11 to storage cylinder 24. Gate 15 opens when the ambient temperature is below the adsorption activation temperature. While the gate is open, the MOF material adsorbs $CO_2$ (or other various gases, depending on the MOF material). This exothermic reaction also generates heat is used to heat one side of the thermoelectric devices 12. The temperature gradient across the thermoelectric device generates electrical current which powers LED lamp 23.

Figure 14:
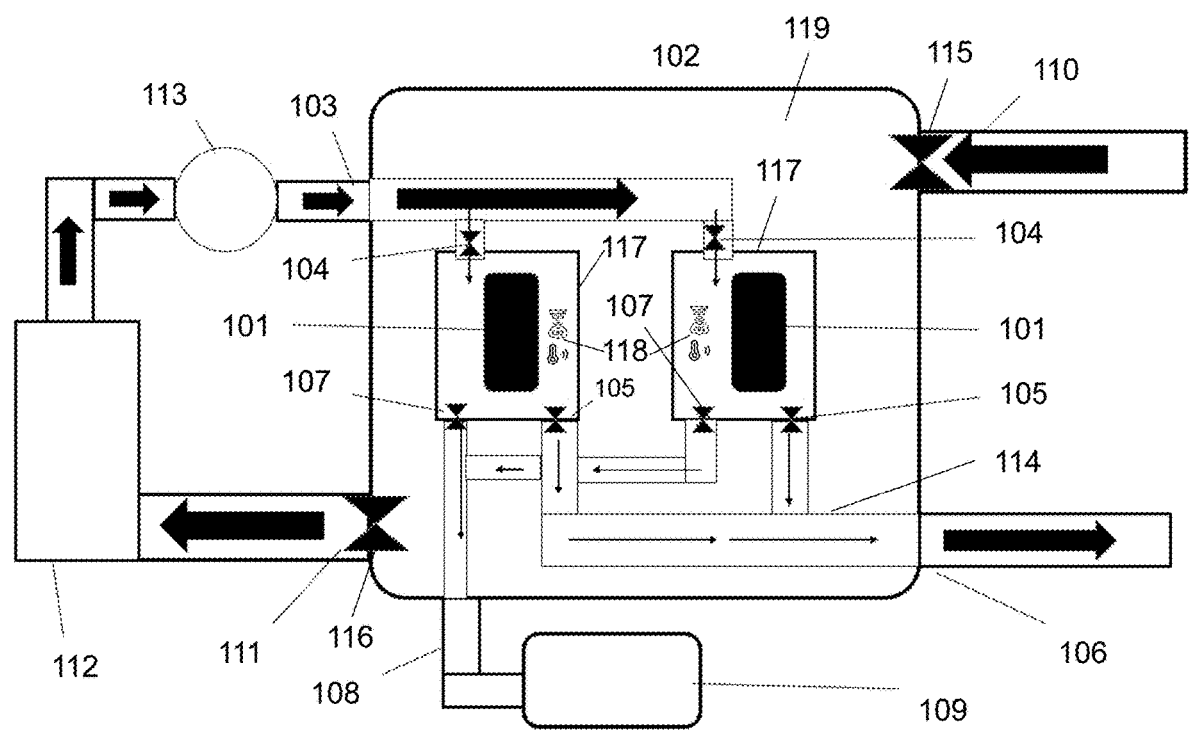
FIG. 14 shows a diagram of an adsorption bed embodiment of the current invention.

FIG. 14 shows an alternate embodiment of an adsorption bed 102 utilizing MOF canisters 101 to process flue gasses exiting from power generation plants. Flue gasses produced by power generation plans are often the byproduct of burning various fuels, including coal, natural gas and oils. As such, these flue gasses contain carbon dioxide ($CO_2$), which has been established to be harmful to the atmosphere, a driver of global warming and climate change. Processes that "clean" flue gasses, i.e. remove harmful compounds such as $CO_2$, often require significant energy or chemical inputs and thus are too inefficient to be utilized. The disclosed adsorption bed 102 removes $CO_2$ from flue gasses passively with little additional energy or chemical input.

Adsorption bed 102 is comprised of MOF canisters 101, first input pipe 103, input gas valves 104, flue gas output valve 105, $CO_2$ output valve 107, flue gas output pipe 106, $CO_2$ output pipe 108, gas storage tank 109, high temperature flue gas output pipe 111, compressor/pump system 112, cooling system 113, high temperature input pipe 110, high temperature flue gas input valve 115, high temperature flue gas output valve 116, and internal pipes 114. This embodiment is described in relation to these elements but it is well understood that other configurations of these components or similar components could be utilized to achieve similar results.

MOF canister 101 is of the type previously described in relation to FIGS. 6-11 above and will be described in greater detail in relation to a later figure. The various valves (104, 105, 107, 115 and 116) utilized are gas control valves well known in the art. These valves may be positioned in both an open position, which allows gas to flow through the valve, or a closed position, where gas may not travel through the valve. Such valves may also be opened partially to let a lower volume of gas (than in the fully open position) pass through the valve. In the preferred embodiment, the valves are electrically controlled and connected to an automated control system that is managed by a computer. The specific type of valve used in the preferred embodiment is a gate valve or industrial gate valve such as those made by Dombor and Honeywell (4" Flanged Industrial Gas Valve with On-off safety shut-off) but other valves well known in the art may be utilized.

The various pipes (103, 106, 108, 110, 111 and 114) used in the preferred embodiment are pipes designed to be utilized for gas transport. These pipes may be insulated or uninsulated and manufactured from materials well known in the art, typically copper and other non-gas permeable metals. In the preferred embodiment, the type of pipe utilized is a seamless steel pipe such as API 5 L type seamless steel pipe but any type of gas delivery/transport pipe well known in the art.

Compressor/pump system 112 is a motorized device utilized for compressing gas. In the preferred embodiment, compressor/pump system 112 includes an electric motor, operation of which is controlled electronically with the electronic control connected to an automated control system managed by a computer. The type of compressor/pump system 112 in the preferred embodiment is a centrifugal pump but any compressor/pump well known in the art could be used.

Cooling system 113 is a heat exchanger well known in the art. This type of cooling system 113 operates by running high temperature gas through internal radiators that dissipate heat. These radiators work by routing gas through systems of piping with high surface area fins. By routing gas through these pipes with connected metal fins, heat is quickly drawn from the high temperature gas to the lower temperature ambient, thus reducing the temperature of the high temperature gas. The specific type of cooling system used in the preferred embodiment is heat recovery units utilizing heat exchangers and/or thermoelectric devices which cool the flue gas to 70-80° C. Any other cooling system well known in the art could be utilized.

Gas storage tank 109 can be any gas storage tank well known in the art. In the preferred embodiment, the gas storage tank 109 is an ASCO CO2 Polyurethane Insulated Storage Tank but any gas storage tank that can be utilized to store gaseous material well known in the art may be utilized.

Adsorption bed 102 operates using the using the following steps to process high temperature flue gas. In the first step, high temperature flue gas, the by-product of power generation or other combustion of fossil fuels, enters absorption bed 102 through high temperature input pipe 110 when high temperature flue gas input valve 115 is opened by the control system (as described in a later figure). At the same time high temperature flue gas input valve 115 is opened by control system, high temperature flue gas output valve 116 is also opened. High temperature flue gas flows through adsorption bed 102 into high temperature flue gas output pipe 111, where it flows into compressor/pump 112 where it is compressed and then into cooling system 113 where it is cooled in the second step. Once the high temperature flue gas is cooled, the system opens input gas valves 104, and the low temperature flue gas enters the MOF canisters 101. Note that low temperature flue gas is the cooled by-product of burning of fossil fuels, and those contains significant amounts of carbon dioxide ($CO_2$).

In the third step, low temperature flue gas, rich with carbon dioxide enters the MOF canisters 101. At this stage, the MOF canister doors are open, and CO2 is adsorbed by the MOF. At the same time, the adsorption process generates heat which creates a net temperature differential across the exterior of the MOF canister 101 and the thermoelectric devices on the exterior of the canister. This temperature differential results in electrical generation by the thermo-electric devices. This electricity is routed out of the adsorption bed 102 and can be used for any suitable purpose, including powering other electrical aspects of the adsorption bed 102. As the MOF become full of $CO_2$ the heat generated by adsorption begins to decrease, which is detected by a heat sensor/CO2 sensor 118 in contact with the flue gas, triggering the fourth step.

In step four, input gas valves 104 are closed and the doors to MOF canisters 101 are opened. Further, high temperature flue gas input valve 115 is opened, allowing high temperature flue gas to enter chamber 119 of the adsorption bed 102. MOF canister chamber 117 is constructed in a way that when the input and output valves are closed, no gas enters from outside MOF canister chamber 117 or is allowed to exit into chamber 119. In this way, the heat of the high temperature flue gas triggers de-adsorption of the $CO_2$ stored in the MOF material, but the high temperature flue gas does not directly interact with the gas inside MOF canister chamber 117. High temperature flue gas output valve 116 is also opened, allowing the high temperature flue gas to flow into the pressurizing and cooling stages.

Step five occurs once the de-adsorption process is complete and the $CO_2$ that had been stored in the MOF material is ready to be pumped from the MOF canister chamber 117. $CO_2$ output valve 107 is opened and CO2 is pumped out through $CO_2$ output pipe 108 into gas storage tank 109.

Step six occurs once all the $CO_2$ is de-adsorbed and the MOFs are empty. $CO_2$ output valves 107 are closed and flue gas output valve 105 opens. The flue gas, with the $CO_2$ removed, exits through flue gas output pipe 106. The flue gas exiting through flue gas output pipe 106 has been cleaned of $CO_2$.

The process repeats steps 1-6 when the high temperature flue gas that entered the system in step four enters the high temperature flue gas output pipe 111 and the cooling/pressurizing process begins.

Figure 15:
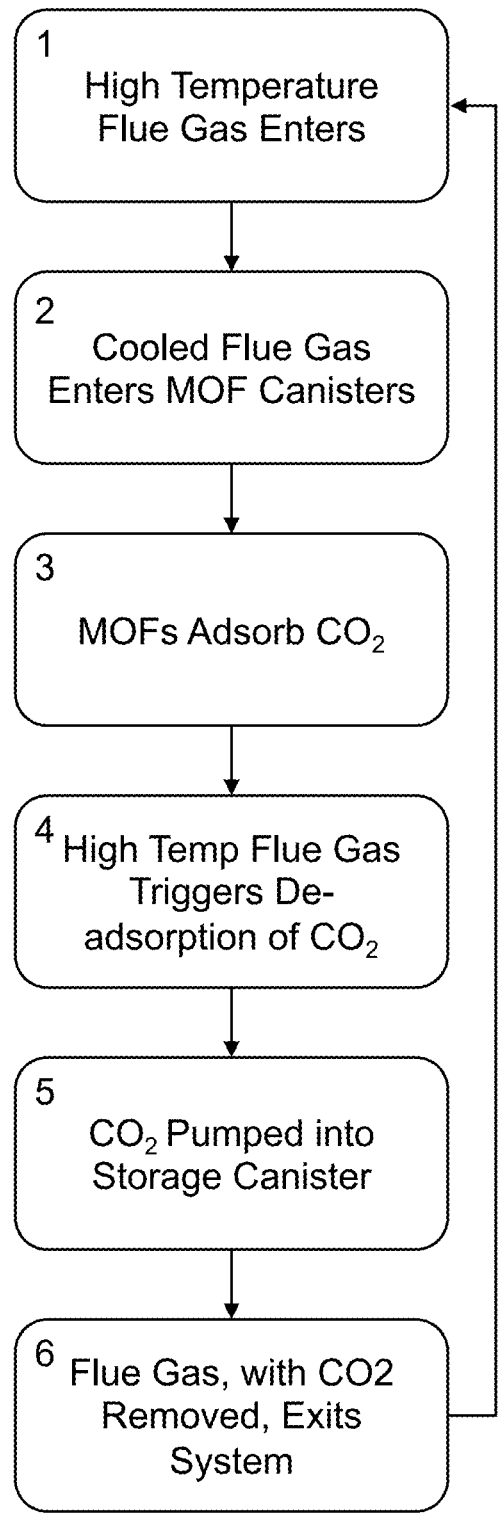
FIG. 15 shows a flow chart of the steps of the process of the adsorption bed.

FIG. 15 is a flow chart showing the steps outlined above in relation to FIG. 14:

Step one: high temperature flue gas, the by-product of power generation or other combustion of fossil fuels, enters absorption bed 102 through high temperature input pipe 110 when high temperature flue gas input valve 115 is opened by the control system (as described in a later figure). At the same time high temperature flue gas input valve 115 is opened by control system, high temperature flue gas output valve 116 is also opened.

Step two: high temperature flue gas flows through adsorption bed 102 into high temperature flue gas output pipe 111, where it flows into compressor/pump 112 where it is compressed and then into cooling system 113 where it is cooled. Once the high temperature flue gas is cooled, the system opens input gas valves 104, and the low temperature flue gas enters the MOF canisters 101. Note that low temperature flue gas is the cooled by-product of burning of fossil fuels, and those contains significant amounts of carbon dioxide ($CO_2$).

Step three: low temperature flue gas, rich with carbon dioxide enters the MOF canisters 101. At this stage, the MOF canister doors are open, and $CO_2$ is adsorbed by the MOF. At the same time, the adsorption process generates heat which creates a net temperature differential across the exterior of the MOF canister 101 and the thermoelectric devices on the exterior of the canister. This temperature differential results in electrical generation by the thermo-electric devices. This electricity is routed out of the adsorption bed 102 and can be used for any suitable purpose, including powering other electrical aspects of the adsorption bed 102. As the MOF become full of $CO_2$ the heat generated by adsorption begins to decrease, which is detected by a heat sensor/CO2 sensor 118 in contact with the flue gas, triggering the fourth step.

Step four: input gas valves 104 are closed and the doors to MOF canisters 101 are closed. Further, high temperature flue gas input valve 115 is opened, allowing high temperature flue gas to enter chamber 119 of the adsorption bed 102. MOF canister chamber 117 is constructed in a way that when the input and output valves are closed, no gas enters from outside MOF canister chamber 117 or is allowed to exit into chamber 119. In this way, the heat of the high temperature flue gas triggers de-adsorption of the $CO_2$ stored in the MOF material, but the high temperature flue gas does not directly interact with the gas inside MOF canister chamber 117. High temperature flue gas output valve 116 is also opened, allowing the high temperature flue gas to flow into the pressurizing and cooling stages.

Step five: once the de-adsorption process is complete and the $CO_2$ that had been stored in the MOF material is ready to be pumped from the MOF canister chamber 117, $CO_2$ output valve 107 is opened and CO2 is pumped out through $CO_2$ output pipe 108 into gas storage tank 109.

Step six: once all the $CO_2$ is de-adsorbed and the MOFs are empty, $CO_2$ output valves 107 are closed and flue gas output valve 105 opens. The flue gas, with the $CO_2$ removed, exits through flue gas output pipe 106. The flue gas exiting through flue gas output pipe 106 has been cleaned of $CO_2$.

The process repeats steps 1-6 when the high temperature flue gas that entered the system in step four enters the high temperature flue gas output pipe 111 and the cooling/pressurizing process begins.

Figure 16:
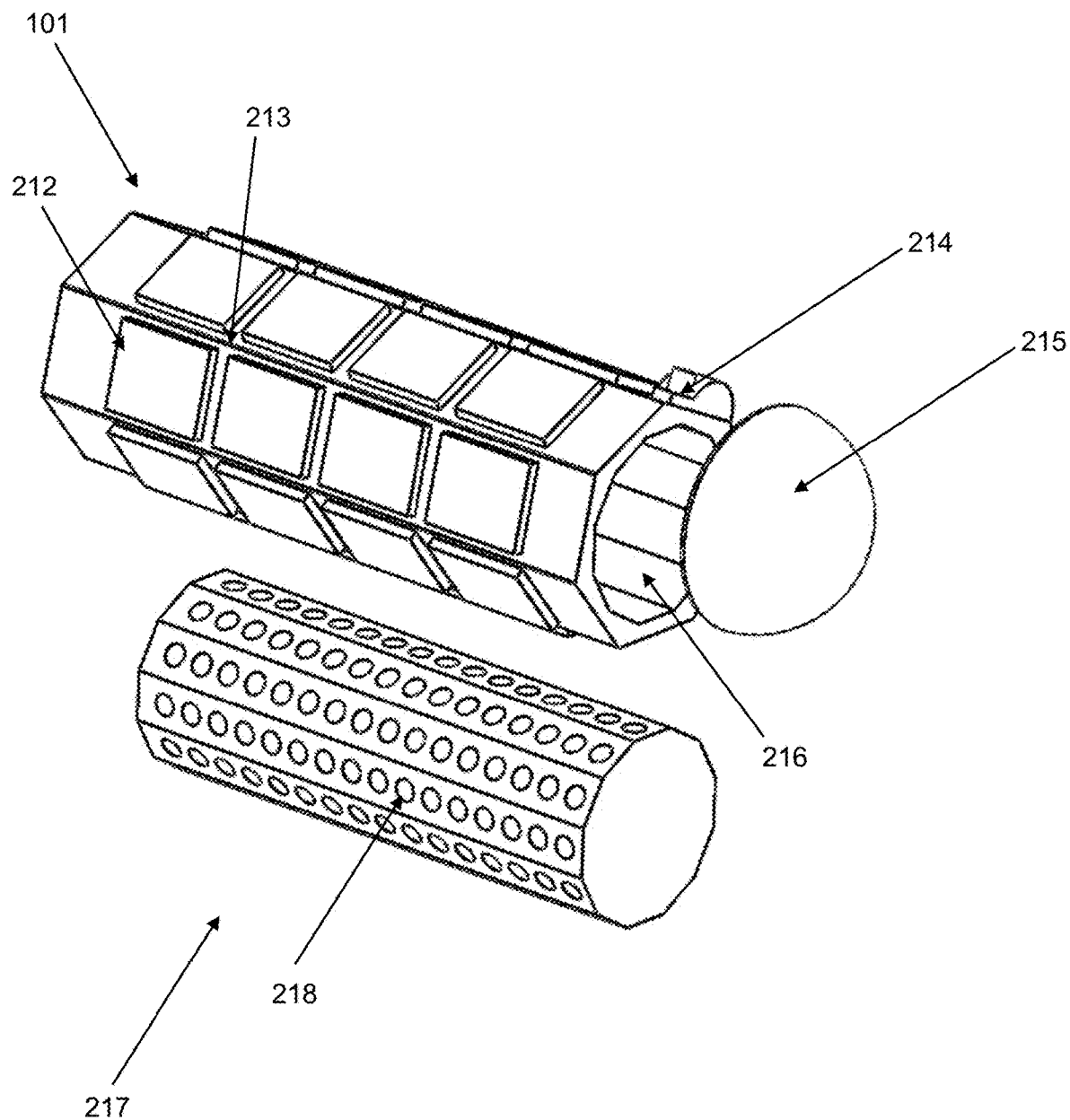
FIG. 16 shows a MOF canister to be used with the adsorption bed.

FIG. 16 shows a view of the MOF canister 101 of the present invention with MOF container 217 removed from the interior of the canister. The canister further includes thermoelectric devices 212 arrayed around the exterior of the canister, wiring 213 connecting the thermoelectric devices to the adsorption bed system 102, gate 215 and gate motor 214. MOF container 217 is shown removed from the MOF canister 101. MOF container 217 is comprised of a plurality of MOF tunnels 218 that each store the MOF material for the device.

MOF canister 101 is made from a thin layer of heat conductive metal. In the preferred embodiment of the invention, aluminum (Al) or copper (Cu) are used, but other suitable heat conductive metals, or other heat conductive materials may be used. The walls of the canister are machined to be as thin as possible in order to effectively conduct heat generated by the MOF material to the thermoelectric devices. MOF canister 101 can be machined in any suitable machine shop to the desired radius and wall thickness.

Thermoelectric devices 212 generate electricity from the heat output by the exothermic adsorption process of carbon dioxide by the MOF in the MOF container 217. As described above and below, the under certain temperature conditions, the MOF material in MOF container 217 adsorbs carbon dioxide ($CO_2$). Heat is a byproduct of this adsorption process and this heat is utilized by thermoelectric devices 212 to generate electricity to power the adsorption bed 102 or other devices. Because of the highly heat conductive design of MOF canister 101, the maximum amount of heat is conducted to the thermoelectric devices 212 in order to generate the maximum amount of electricity. These thermoelectric devices 212 are Peltier type devices and in the preferred embodiment are a combination of more than one type where it is used at different high and low temperature differences; for low temperature we have for the preferred embodiment HiLetGo Semiconductor Refrigeration Tablets TEC1-12706 12V 6 A Heatsink Thermoelectric Cooler Cooling Peltier Plate Module in a 40×40 MM size. And for high temperature the preferred embodiment HiTemp ETX Series capable of working at temperature difference of up to 80° C. and working conditions of 150° C. While the above mentioned devices are used in the preferred embodiment, a variety of thermoelectric devices, of both Peltier and Seebeck variety, are suitable for this invention. The thermoelectric device utilized depends on the characteristics of the MOF material, the temperature at which adsorption and desorption occurs and the specific gas desorbed by the device.

In the preferred embodiment, 12 of these devices are installed on the exterior of MOF canister 101. One side of the device is glued to the canister and the other side is exposed to the open air. Contact cement adhesive, as sold by Loctite brand, is applied around the edges of thermoelectric device to adhere them to the outside of the MOF canister 101. The adhesive is applied in a way to allow maximum surface area of the thermoelectric device to be in direct contact with the metal MOF canister 101 for maximum heat conduction and thus electricity generation. Wires 213 are connected to each of the thermoelectric devices and connected the adsorption bed 102 or other devices.

Gate 215 allows the interior of MOF canister 101 to be opened or closed to ambient air. Gate 215 is normally open at low temperatures allowing cool air to flow into the MOF material contained in the MOF container 217. In the preferred embodiment, an MOF material is chosen with an adsorption activation temperature that aligns with the low temperature flue gas temperature so that when in contact with the low temperature flue gas, the MOF material adsorbs $CO_2$. The material is also chosen to have a desorption activation temperature that aligns with the high temperature flue gas so $CO_2$ is desorbed from the MOF material when in contact with that gas. Gate 215 includes a gasket ring to seal the desorbed gas in the MOF canister 101 such that it can be pumped out and stored. The gate 215 is made of the same material as the MOF canister 101, generally a thin metal with good heat conduction such as aluminum or copper. The opening and closing of gate 215 is controlled by gate motor 214. Gate motor 214 is a low power electric servo motor controlled by the control system.

MOF container 217 contains a plurality of MOF tunnels 218 that contain MOF material. MOF container 217 is machined out of a similar heat conductive material as MOF canister 101 such as aluminum or copper. MOF container 217 can be machined in a suitable machine shop to create the canister and MOF tunnels 218 of suitable size. MOF container 217 is removable from MOF canister 101 so that MOF material can be inserted into the MOF tunnels 218.

MOF tunnels 218 contain the MOF material selected for the present invention. In the preferred embodiment, powder MOF sold under the tradename Basolite™ is used. MOFS is chosen for CO2 capture and replace cycle, though other types of MOFs can be used such as MOF74. MOFS and MOF74 are the two main MOF crystal powders that are sold significant quantities for adsorbing CO2, but other specialty MOFs can be synthesized.

Choosing the specific MOF depends on the amount of heat generated to be generated by the adsorption process and the design of the battery. For example, for maximum heat output, Co-MOF74 should be selected. Co-MOF74 will generate a large amount of heat during the adsorption process. However, during the desorption process, there must be enough heat in the high temperature flue gas to release the gases trapped inside the MOFs. MOF5 may be suitable for lower temperature environments. It produces lower heat levels during the adsorption process, but also requires less heat during the desorption cycle to release the gas. This approach requires more MOF material in the canister 217 and choice of a thermoelectric device with a lower temperature gradient.

Figure 17:
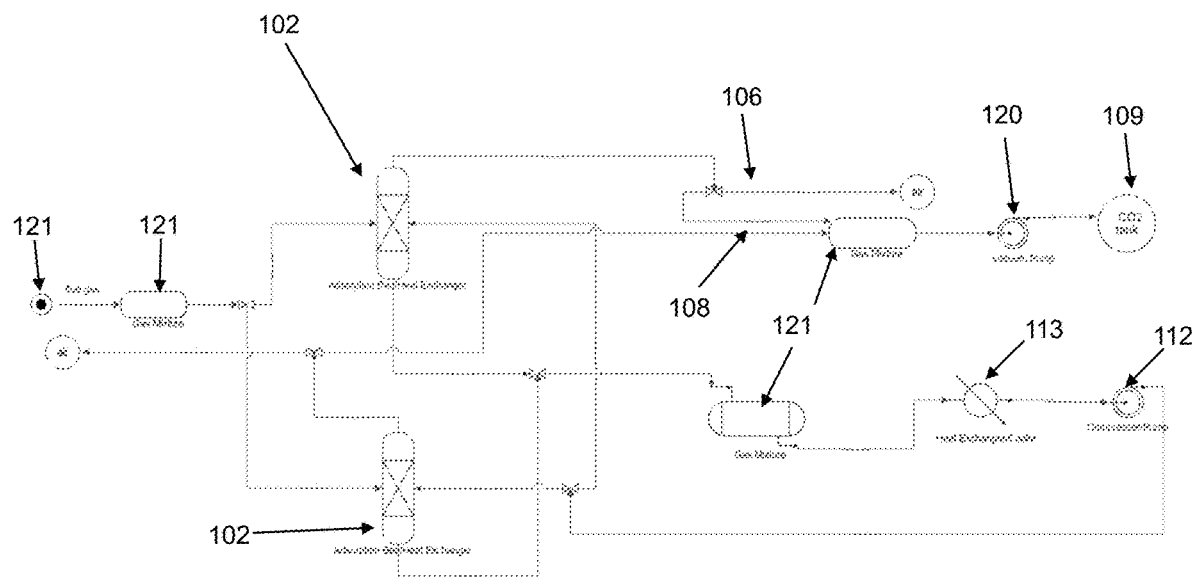
FIG. 17 shows a system diagram utilizing multiple adsorption beds.

FIG. 17 shows a system diagram using multiple adsorption beds 102. In this system, high temperature flue gas enters at high temperature input pipe 110. High temperature flue gas is routed to gas mixture module 121. The use of gas mixture module 121 allows control of the purity of $CO_2$ that is pumped into gas storage tank 109. Any change in percentage purity of the $CO_2$ mixture will be addressed in gas mixture module 121. Gas mixture module 121 is a mechanical, electrical or pneumatically controlled gas blender such as such industrial models manufactured by WITT. From this point, the high temperature flue gas is routed to a first and a second adsorption bed 102. Each adsorption bed 102 is connected to cooler 113 and compressor/pump 112 where the flue gas is cooled for introduction into the adsorption beds 102. Adsorption beds 102 are also connected to flue gas output pipe 106 where the cleaned flue gas is output to the atmosphere. Further, adsorption beds 102 are connected to CO2 output pipe 108 where $CO_2$ removed from flue gas enters gas mixture module 121, then vacuum pump 120 for compression and finally into gas storage tank 109 for storage. Vacuum pump 120 compresses $CO_2$ for storage of higher amounts of CO2 in a lower volume storage tank and has the following specifications in the preferred embodiment an ASCO carbon dioxide vacuum pump but any suitable vacuum pump well known in the art could be used.

Figure 18:
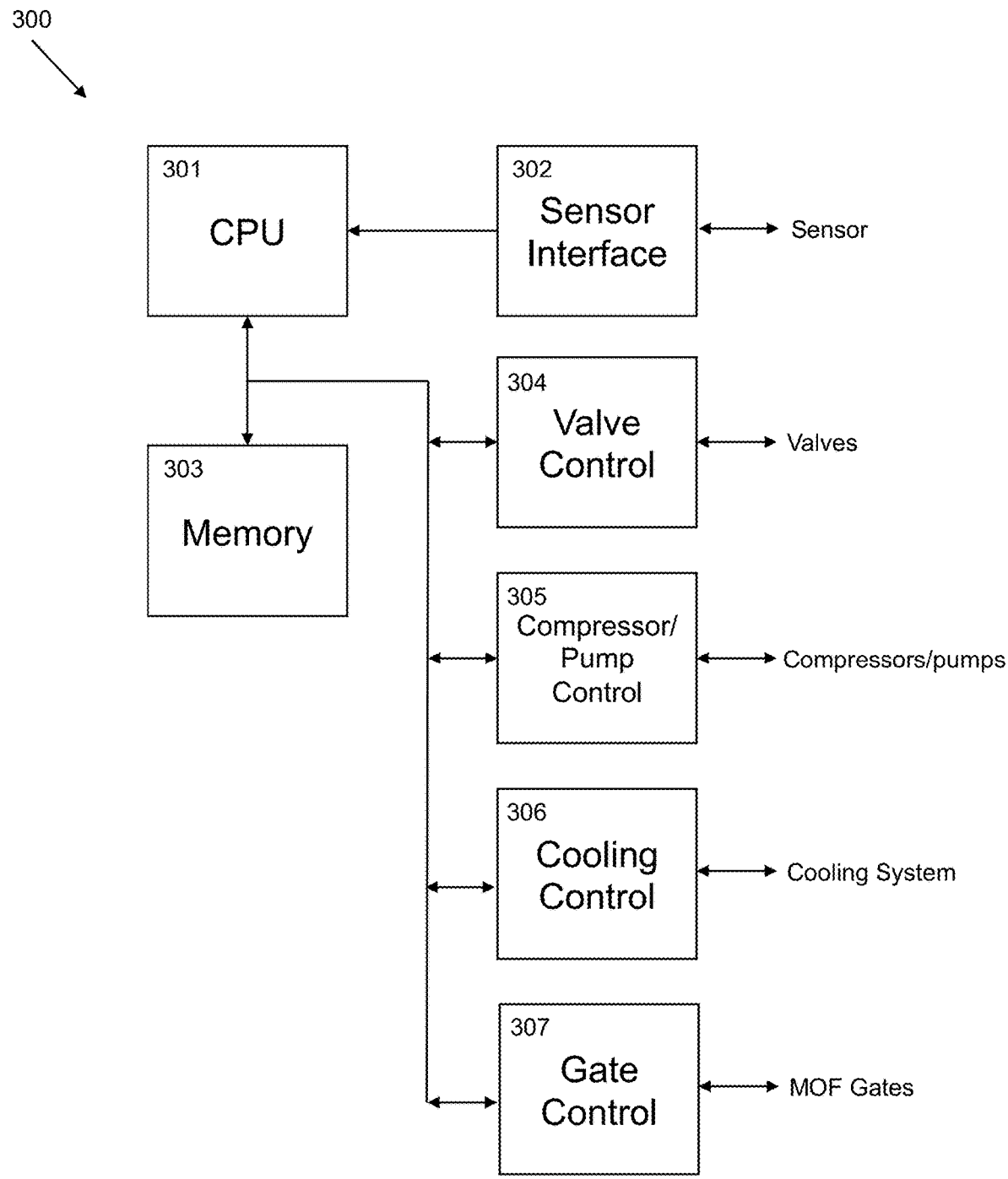
FIG. 18 shows a block diagram of the adsorption bed control system.

FIG. 18 is a block diagram of adsorption bed control system 300 comprising CPU 301, sensor interface 302, memory 303, valve control 304, compressor/pump control 305 and cooling control 306. Adsorption bed control system 300 controls the opening and closing of the various valves in the adsorption bed system, the activation of the compressors/pumps and cooling system.

CPU 301 may be any microprocessor well known in the art, including those made by Intel, AMD and Arm. CPU 301 is connected to memory 303 via a memory bus supporting bidirectional data flow between CPU 301 and memory 303. Memory 303 is any memory well known in the art, however non-volatile memory such as Flash memory is preferred. This memory stores both the control program and the various states of the control system to be accessed by the CPU 301. Sensor interface 302 reads the state of the various sensors in the adsorption bed 102, including $CO_2$/temperature sensor 118. Based on the state of the sensors, the CPU

301 may send a signal to open or close the valves connected to valve control 304. Valves such as input gas valves 104, flue gas output valve 105, and $CO_2$ output valve 107 are controlled by the valve control 304 module and in bidirectional communication with the module. Compressor/pump control 305 activates and deactivates compressor/pump system 112 based on the signals received from CPU 301. Compressor/pump control 305 is in bidirectional communication with any compressors/pumps in the system. Cooling control 306 is in bidirectional communication with cooling system 113 and activates/deactivates cooling system 113 based on signals from the CPU 301. Lastly, gate control 307 is in bidirectional communication with MOF gates 215 and opens or closes each gate 215 based on signals from the CPU 301.

The present figures and detailed description disclose the preferred embodiment of the claimed invention and are not meant to limit the scope of the claims. Many other configurations and embodiments are possible within the scope of the present claims.

The invention claimed is:

1. A gas collection device for removing a specified gas and outputting a filtered gas from an input gas comprising:
   a first enclosed gas-tight chamber with a high temperature gas input, a high temperature gas output, a low temperature gas input, a specified gas output and a filtered gas output;
   at least one second enclosed gas-tight chamber enclosed within the first gas-tight chamber, the second enclosed gas-tight chamber comprising:
      a low temperature gas input where the flow of input gas is controlled by an input gas valve;
      a specified gas output where the flow of specified gas is controlled by a specified output gas valve;
      a filtered gas output where the flow of filtered gas is controlled by a filtered gas output valve;
      a canister with an exterior, a cavity, a gate and a specified gas output, the canister further comprising;
         a container for metal organic framework material, the container being shaped to fit within the cavity of the canister and having a plurality of tunnels, each tunnel being shaped to contain metal organic framework material;
         at least one thermoelectric device attached to the exterior of the canister, the thermoelectric device attached to conduct heat from the canister wall to the thermoelectric device, the thermoelectric devices each attached to wiring configured to output a current and voltage output;
         the metal organic framework material chosen to adsorb the specified gas below an adsorption activation temperature and to desorb the specified gas above a desorption activation temperature;
         the gate having an electric motor configured to open the gate when a first environmental condition is present and to close the gate when the first environmental condition is not present;
      the specified gas output of the canister connected to the specified gas output of the second gas-tight chamber;
      the specified gas output of the second gas-tight chamber connected to the specified gas output of the first gas-tight chamber;
      the filtered gas output of the second gas-tight chamber connected to the filtered gas output of the first gas-tight chamber; and
      a sensor for detecting the first environmental condition within the second gas-tight chamber;
   a compressor and a cooling system connected between the high temperature gas input and the low temperature gas input of the first gas-tight enclosure where the high temperature input gas is cooled and pressurized and input to the compressor and cooling system is controlled by a high temperature gas input valve and output of the compressor and cooling system is controlled by a low temperature gas output valve; and
   a gas storage tank connected to the specified gas output of the first gas-tight chamber.

2. The gas collection device of claim 1 where the specified gas is carbon dioxide.

3. The gas collection device of claim 1 where the filtered gas is output into the atmosphere.

4. The gas collection device of claim 1 where the input gas is flue gas output from a power generation plant.

5. The gas collection device of claim 1 where the input gas valve, specified gas output valve, filtered gas output valve, high temperature gas input valve, low temperature gas output valve, the gates and the compressor and cooling system are controlled by a computer control system comprising a CPU, a memory, a sensor interface connected to the sensor, a valve control module, a compressor control module, a cooling control module and a gate control module.

6. The battery and gas storage device of claim 1 where the canister is formed of a material selected from the group consisting of aluminum, copper and steel.

7. The battery and gas storage device of claim 1 where the container is formed of a material selected from the group consisting of aluminum, copper and steel.

8. The battery and gas storage device of claim 1 where the MOF material is a powdered MOF.

9. The battery and gas storage device of claim 1 where the MOF material is MOF5.

10. The battery and gas storage device of claim 1 where the MOF material is Co-MOF74.

11. The battery and gas storage device of claim 1 where the thermoelectric device is a Peltier type device.

12. The battery and gas storage device of claim 1 where the thermoelectric device is a Seebeck type device.

13. A method for removing a specified gas and outputting a filtered gas from an input gas comprising:
   inputting high temperature input gas into a first gas tight enclosure;
   outputting high temperature input gas into a compressor and a cooling system;
   cooling and pressuring the high temperature input gas into a low temperature input gas;
   inputting the low temperature input gas into a second gas-tight enclosure comprising a canister with an exterior, a cavity, a gate and a specified gas output, the canister further comprising;
      a container for metal organic framework material, the container being shaped to fit within the cavity of the canister and having a plurality of tunnels, each tunnel being shaped to contain metal organic framework material;
      at least one thermoelectric device attached to the exterior of the canister, the thermoelectric device attached to conduct heat from the canister wall to the thermoelectric device, the thermoelectric devices each attached to wiring configured to output a current and voltage output;
      the metal organic framework material chosen to adsorb the specified gas below an adsorption activation temperature and to desorb the specified gas above a desorption activation temperature;

the gate having an electric motor configured to open the gate when a first environmental condition is present and to close the gate when the first environmental condition is not present;

opening the gate when the first environmental condition is present;

adsorbing the specified gas by the metal organic framework material until the first environmental condition is no longer present and the gate closes;

inputting high temperature input gas to the first gas-tight enclosure such that the specified gas is de-adsorbed from the metal organic framework material;

pumping the specified gas from the canister specified gas output into a gas storage tank;

pumping the filtered gas from the second gas-tight enclosure.

14. The method of claim 13 where the specified gas is carbon dioxide.

15. The method of claim 13 where the filtered gas is output into the atmosphere.

16. The method of claim 13 where the input gas is flue gas output from a power generation plant.

17. The method of claim 13 where the inputs, the outputs, the gates and the compressor and cooling system are controlled by a computer control system comprising a CPU, a memory, a sensor interface connected to a sensor, a valve control module, a compressor control module, a cooling control module and a gate control module.

* * * * *